United States Patent
Chang et al.

(10) Patent No.: US 10,627,840 B2
(45) Date of Patent: Apr. 21, 2020

(54) ELECTRONIC SYSTEM FOR ADJUSTING OPERATING VOLTAGE AND METHOD OF MANUFACTURING THE SAME

(71) Applicant: NANYA TECHNOLOGY CORPORATION, New Taipei (TW)

(72) Inventors: Chuan-Jen Chang, Baoshan Township (TW); Hao-Huan Hsu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/200,124

(22) Filed: Nov. 26, 2018

(65) Prior Publication Data

US 2019/0121379 A1 Apr. 25, 2019

Related U.S. Application Data

(62) Division of application No. 15/793,692, filed on Oct. 25, 2017, now Pat. No. 10,268,222.

(51) Int. Cl.
| | |
|---|---|
| *G05F 1/565* | (2006.01) |
| *G05F 1/56* | (2006.01) |
| *G06F 1/28* | (2006.01) |
| *G06F 1/10* | (2006.01) |
| *G11C 5/14* | (2006.01) |
| *G11C 16/30* | (2006.01) |

(52) U.S. Cl.
CPC .............. *G05F 1/565* (2013.01); *G05F 1/561* (2013.01); *G06F 1/10* (2013.01); *G06F 1/28* (2013.01); *G11C 5/14* (2013.01); *G11C 16/30* (2013.01)

(58) Field of Classification Search
CPC . G05F 1/565; G05F 1/561; G06F 1/10; G06F 1/28; G11C 5/14; G11C 16/30
See application file for complete search history.

(56) References Cited

U.S. PATENT DOCUMENTS

| | | | |
|---|---|---|---|
| 8,736,356 B2* | 5/2014 | Yoo | G05F 1/56 327/540 |
| 2004/0003301 A1* | 1/2004 | Nguyen | G06F 1/206 713/300 |
| 2005/0231183 A1 | 10/2005 | Li et al. | |

(Continued)

FOREIGN PATENT DOCUMENTS

| | | |
|---|---|---|
| CN | 1407701 A | 4/2003 |
| CN | 1720654 A | 1/2006 |

(Continued)

OTHER PUBLICATIONS

Machine translation of Taiwan OA submitted by applicants dated Mar. 4, 2020. (Year: 2020).*

(Continued)

*Primary Examiner* — Emily P Pham
(74) *Attorney, Agent, or Firm* — Muncy, Geissler, Olds & Lowe, PC

(57) ABSTRACT

A system includes a first circuit, a second circuit and a regulator. The first circuit is configured to operate at a first operating voltage, wherein the first operating voltage drops by a first voltage level while the first circuit operates. The second circuit is coupled with the first circuit at a tap, and configured to operate at a second operating voltage. The regulator is configured to provide a supply voltage to the first circuit and the second circuit via the tap. The regulator is also configured to raise the supply voltage in response to the first voltage level.

9 Claims, 6 Drawing Sheets

(56) References Cited

U.S. PATENT DOCUMENTS

| | | | |
|---|---|---|---|
| 2010/0008175 A1* | 1/2010 | Sweere | G06F 12/0866 365/229 |
| 2012/0153910 A1 | 6/2012 | Bulzacchelli et al. | |
| 2015/0100812 A1* | 4/2015 | Jing | G06F 1/266 713/340 |
| 2017/0102754 A1* | 4/2017 | Chi | G11C 5/147 |
| 2017/0255213 A1* | 9/2017 | Oikarinen | G06F 1/26 |

FOREIGN PATENT DOCUMENTS

| | | |
|---|---|---|
| CN | 1841898 A | 10/2006 |
| CN | 101056066 A | 10/2007 |
| CN | 101330257 B | 12/2008 |
| CN | 101518389 A | 9/2009 |
| CN | 202798460 U | 3/2013 |
| CN | 104270009 A | 1/2015 |
| TW | 485272 | 5/2002 |
| TW | 201126300 A1 | 8/2011 |
| TW | 201207591 A1 | 2/2012 |
| TW | 201245920 A1 | 11/2012 |
| TW | M454670 U1 | 6/2013 |
| TW | 201432404 A | 8/2014 |
| TW | 201643585 A | 12/2016 |

OTHER PUBLICATIONS

Taiwanese Office Action in application No. 107119182 dated Dec. 9, 2019; pp. 1-3.

* cited by examiner

ELECTRONIC SYSTEM FOR ADJUSTING OPERATING VOLTAGE AND METHOD OF MANUFACTURING THE SAME

PRIORITY CLAIM AND CROSS-REFERENCE

This application is a divisional application of U.S. patent application Ser. No. 15/793,692, filed on Oct. 25, 2017. The entirety of the above-mentioned patent application is hereby incorporated by reference herein and made a part of this specification.

TECHNICAL FIELD

The present disclosure relates to an electronic system, and more particularly, to an electronic system including a regulator.

DISCUSSION OF THE BACKGROUND

With increasing technological development, a wide range of electronic devices is used to achieve various purposes. An electronic device comprises a plurality of electronic components. Generally, different kinds of electronic components function using different voltages.

A power supply is essential for electronic devices, including personal computers, industrial computers, servers, communication products and network products. Usually, the user may simply plug a power supply input cable into an AC wall outlet, which is commonly found in homes and offices, so as to receive an AC voltage. The power supply converts the AC voltage into a regulated DC output voltage for powering the electronic device. For example, a common DC output voltage is 12 volts. The regulated DC output voltage is transmitted to the electronic device through a power cable.

This Discussion of the Background section is provided for background information only. The statements in this Discussion of the Background are not an admission that the subject matter disclosed in this section constitutes prior art to the present disclosure, and no part of this section may be used as an admission that any part of this application, including this Discussion of the Background section, constitutes prior art to the present disclosure.

SUMMARY

One aspect of the present disclosure provides a system. The system includes a regulator, a first circuit and a first sensing circuit. The regulator is configured to provide a supply voltage, and to raise the supply voltage based on a sensing result. The first circuit is configured to operate at a first operating voltage, which is derived from the supply voltage. The first sensing circuit, independent of the regulator, is configured to provide a first sensing result by sensing the first operating voltage provided to the first circuit, wherein the first sensing circuit in space of layout is closer than the regulator to the first circuit.

In some embodiments, the first sensing circuit is located between the first circuit and the regulator.

In some embodiments, the first circuit is located between the first sensing circuit and the regulator.

In some embodiments, the first sensing circuit includes a first comparator configured to provide the first sensing result by comparing a reference voltage to the first operating voltage.

In some embodiments, the regulator includes a host sensing circuit, integrated in the regulator, wherein the host sensing circuit is configured to provide a host sensing result by sensing the supply voltage, wherein one of the first sensing result and the host sensing result serves as the sensing result; and a regulator core configured to raise the supply voltage based on the sensing result.

In some embodiments, while the first circuit operates, the first circuit consumes a first operating current, wherein the first operating current is a first portion of a supply current provided by the regulator, and the system further includes a second circuit configured to consume a second operating current, less than the first operating current, while the second circuit operates, wherein the second operating current is a second portion of the supply current.

Another aspect of the present disclosure provides a system. The system includes a first circuit, a second circuit and a regulator. The first circuit is configured to operate at a first operating voltage, wherein the first operating voltage drops by a first voltage level while the first circuit operates. The second circuit, coupled with the first circuit at a tap, is configured to operate at a second operating voltage. The regulator is configured to provide a supply voltage to the first circuit and the second circuit via the tap, and to, in response to the first voltage level, raise the supply voltage.

In some embodiments, a first sensing circuit is configured to provide a first sensing result, by sensing the first operating voltage. The regulator is configured to in response to the first voltage level, raise the supply voltage includes the regulator configured to raise the supply voltage based on the sensing result.

In some embodiments, the first sensing circuit is independent of the regulator.

In some embodiments, the first sensing circuit in space of layout is arranged closer than the regulator to the first circuit.

In some embodiments, the first sensing circuit is located between the first circuit and the regulator.

In some embodiments, the first circuit is located between the first sensing circuit and the regulator.

In some embodiments, the first sensing circuit includes a first comparator configured to provide the first sensing result by comparing a reference voltage to the first operating voltage.

In some embodiments, the regulator includes a host sensing circuit, integrated in the regulator, wherein the host sensing circuit is configured to provide a host sensing result by sensing the supply voltage; a regulator core configured to raise the supply voltage based on the sensing result, wherein one of the first sensing result and the host sensing result serves as the sensing result.

In some embodiments, while the first circuit operates, the first circuit consumes a first operating current, wherein the first operating current is a first portion of a supply current provided by the regulator; and while the second circuit operates, the second circuit consumes a second operating current, wherein the second operating current is a second portion of the supply current, and the second operating current is less than the first operating current.

In some embodiments, a second buffering device is configured to stabilize the second operating voltage.

Another aspect of the present disclosure provides a method. The method includes providing a substrate; dividing the substrate into a first region, a second region and a third region, which are separate from each other, wherein the second region in space of layout is closer than the third region to the first region; and forming a first circuit in the first region, a first sensing circuit in the second region and a regulator in the third region, wherein the regulator provides a supply voltage, and raises the supply voltage based on a sensing result, wherein the first circuit operates at a first operating voltage, which is derived from the supply voltage, and wherein the first sensing circuit provides a first sensing result by sensing the first operating voltage provided to the first circuit.

In the present disclosure, since each of the first circuit and the second circuit is accompanied by a sensing circuit, when any one of the first operating voltage and the second operating voltage drops, the regulator raises the supply voltage, thereby adjusting the one of the first operating voltage and the second operating voltage, which has dropped.

In some existing systems free of a sensing circuit of the present disclosure, to adjust a supply voltage provided by a regulator of the existing system, the regulator includes an integrated comparator. The comparator compares a voltage at a node to a reference voltage. The voltage at the node is affected by both the first operating voltage and the second operating voltage. As such, for example, when one of the first operating voltage and the second operating voltage drops, the voltage at the node may not be decreased because there is no decrease of the other one of the first operating voltage and the second operating voltage. As a result, the regulator does not raise the supply voltage, and therefore the one of the first operating voltage and the second operating voltage cannot be increased.

In the present disclosure, the first sensing circuit and the regulator core communicate with each other by means of a digital signal. Compared to data of an analog signal communication, data of a digital signal communication is relatively difficult to be distorted. As such, content of a digital signal transmitted by the first sensing circuit is substantially the same as content of a digital signal received by the regulator core. Since the regulator core is provided with the relatively accurate sensing result, relatively little time is required for the regulator to adjust the first operating voltage to a desired voltage level.

In some existing systems, the existing system is absent of the first sensing circuit of the present disclosure. The first operating voltage is sensed by a regulator of the existing system. Since the parasitic component exists between the regulator and the first circuit, and since the regulator and the first circuit communicate with each other by means of an analog signal, the regulator is unable to accurately know a variation of the first operating voltage. As such, relatively more time is required for the regulator to adjust the first operating voltage to a desired voltage level.

Moreover, in another embodiment of the present disclosure, since the first circuit consumes a relatively greater amount of current, the first operating voltage drops by a greater amount than the second operating voltage. Therefore, compared to the second operating voltage, it is more useful to sense the first operating voltage. As a result, in the present disclosure, only a single sensing circuit is adopted to sense the first operating voltage. By arranging a sensing circuit based on the above factors, the design is more cost-efficient than previous designs.

The foregoing has outlined rather broadly the features and technical advantages of the present disclosure in order that the detailed description of the disclosure that follows may be better understood. Additional features and advantages of the disclosure are described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
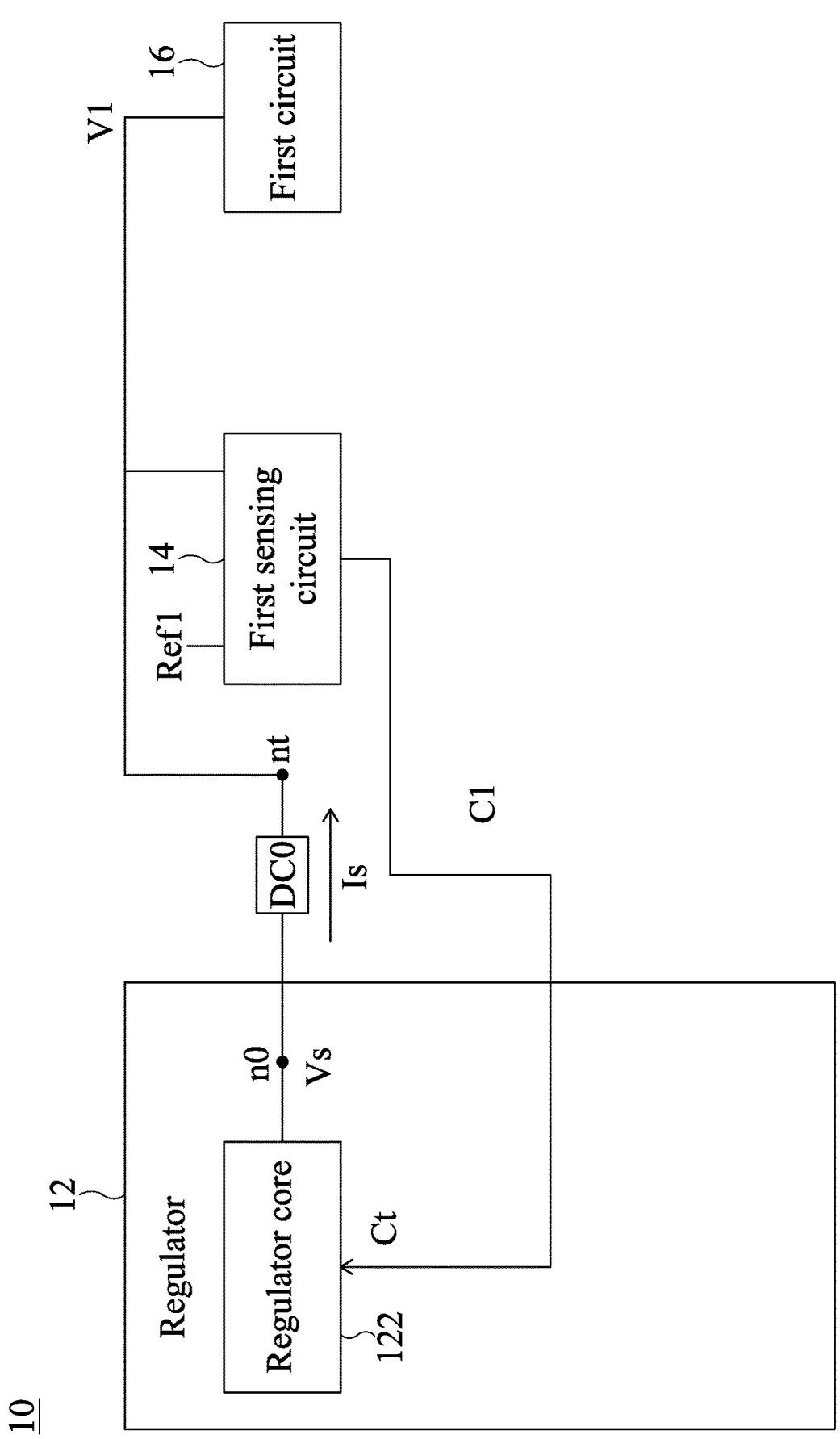
FIG. 1 is a block diagram of a system in accordance with some embodiments of the present disclosure.

Embodiments, or examples, of the disclosure illustrated in the drawings are now described using specific language. It shall be understood that no limitation of the scope of the disclosure is thereby intended. Any alteration or modification to the described embodiments, and any further applications of principles described in this document, are to be considered as normally occurring to one of ordinary skill in the art to which the disclosure relates. Reference numerals may be repeated throughout the embodiments, but this does not necessarily require that feature(s) of one embodiment apply to another embodiment, even if they share the same reference numeral.

It shall be understood that when an element is referred to as being "connected to" or "coupled with" another element, it may be directly connected to or coupled to the other element, or intervening elements may be present.

It shall be understood that, although the terms first, second, third, etc. may be used herein to describe various elements, components, regions, layers or sections, these elements, components, regions, layers or sections should not be limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It shall be further understood that the terms "comprises" and "comprising," when used in this specification, specify the presence of stated features, integers, steps, operations, elements, or components, but do not preclude the presence or addition of one or more other features, integers, steps, operations, elements, components, or groups thereof.

FIG. 1 is a block diagram of a system 10 in accordance with some embodiments of the present disclosure. Referring to FIG. 1, the system 10 includes a regulator 12 including a regulator core 122, a first sensing circuit 14 and a first circuit 16.

The regulator 12 functions to provide a supply voltage Vs and a supply current Is to the first circuit 16 via a power bus, thereby providing a first operating voltage V1 to the first circuit 16. Moreover, the regulator 12 functions to raise the supply voltage Vs based on a sensing result Ct. In an embodiment, the regulator 12 includes a boost converter, a buck converter, or any suitable regulator.

The first circuit 16 operates at the first operating voltage V1 derived from the supply voltage Vs in an ideal operating environment. The supply voltage Vs becomes the first operating voltage V1 because of, for example, a parasitic effect on a power bus between the regulator 12 and the first circuit 16. For convenience of discussion, a parasitic component DC0, which may represent the parasitic capacitor or the parasitic resistor of the power bus, is shown. During operation of the first circuit 16, the first operating voltage V1 gradually drops, and is subsequently pulled up by means of the first sensing circuit 14 and the regulator 12, as will be described in detail below.

In an embodiment, the function of the first circuit 16 may be logic (e.g., central processing unit, microcontroller, etc.), memory (e.g., dynamic random access memory (DRAM), static random access memory (SRAM), etc.), power management (e.g., power management integrated circuit (PMIC)), radio frequency (RF), sensor, signal processing (e.g., digital signal processing (DSP), the like, or a combination thereof.

The first sensing circuit 14 is independent of the regulator 12. That is to say, the first sensing circuit 14 is not integrated in the regulator 12. Moreover, the first sensing circuit 14 functions to provide a first sensing result C1 by sensing the first operating voltage V1 provided to the first circuit 16. In the present embodiment, the first sensing result C1 serves as the sensing result Ct.

In an embodiment, the first sensing circuit 14 includes a first comparator configured to provide the first sensing result C1 to the regulator core 122 by comparing a reference voltage Ref1 to the first operating voltage V1.

Moreover, the first sensing circuit 14 is placed near enough to the first circuit 16, which will be described in detail with reference to FIG. 2. As such, there is substantially no parasitic effect existing between the first sensing circuit 14 and the first circuit 16. As illustrated in FIG. 1, there is no parasitic component, like the parasitic component DC0, existing between the first sensing circuit 14 and the first circuit 16. Consequently, the first sensing circuit 14 is able to be relatively accurate in sensing the first operating voltage V1. For example, it is assumed that the first operating voltage V1 decreases by 0.3 volts (V). The first sensing circuit 14 can accurately sense that the first operating voltage V1 decreases by 0.3V, instead of voltage levels other than 0.3V. As such, the first sensing circuit 14 is able to provide the relatively accurate sensing result C1 to the regulator 12. As such, relatively little time is required for the regulator 12 to adjust the first operating voltage V1 to a desired voltage level by adjusting the supply voltage Vs based on the relatively accurate sensing result C1.

Moreover, the first sensing circuit 14 and the regulator core 122 communicate with each other by means of a digital signal. Compared with data of an analog signal communication, a data of a digital signal communication is relatively difficult to be distorted. As such, content of a digital signal transmitted by the first sensing circuit 14 is substantially the same as content of a digital signal received by the regulator core 122. As a result, following the above assumption, the regulator core 122 is informed that the first operating voltage V1 is decreased by 0.3V, instead of by a voltage level other than 0.3V. Since the regulator core 122 is provided with the relatively accurate sensing result C1, relatively little time is required for the regulator 12 to adjust the first operating voltage V1 to a desired voltage level.

In summary, with the first sensing circuit 14, the regulator 12 is able to be relatively accurate in knowing a variation of the first operating voltage V1. As a result, relatively little time is required for the regulator 12 to adjust the first operating voltage V1 to a desired voltage level.

In some existing systems, the existing system is absent of the first sensing circuit 14 of the present disclosure. For convenience of discussion, a regulator 12 is taken as a regulator of the existing system. The first operating voltage V1 is sensed by the regulator 12. Since the parasitic component DC0 exists between the regulator 12 and the first circuit 16, and since the regulator 12 and the first circuit 16 communicate with each other by means of an analog signal, the regulator 12 is unable to accurately know a variation of the first operating voltage V1. For example, the first operating voltage V1 decreases by 0.3V. However, the regulator 12 detects that the first operating voltage V1 decreases by, for example, 0.4 V, instead of 0.3V, because of the parasitic component DC0 and an analog signal communication between the regulator 12 and the first circuit 16. As such, relatively more time is required for the regulator 12 to adjust the first operating voltage V1 to a desired voltage level.

Figure 2:
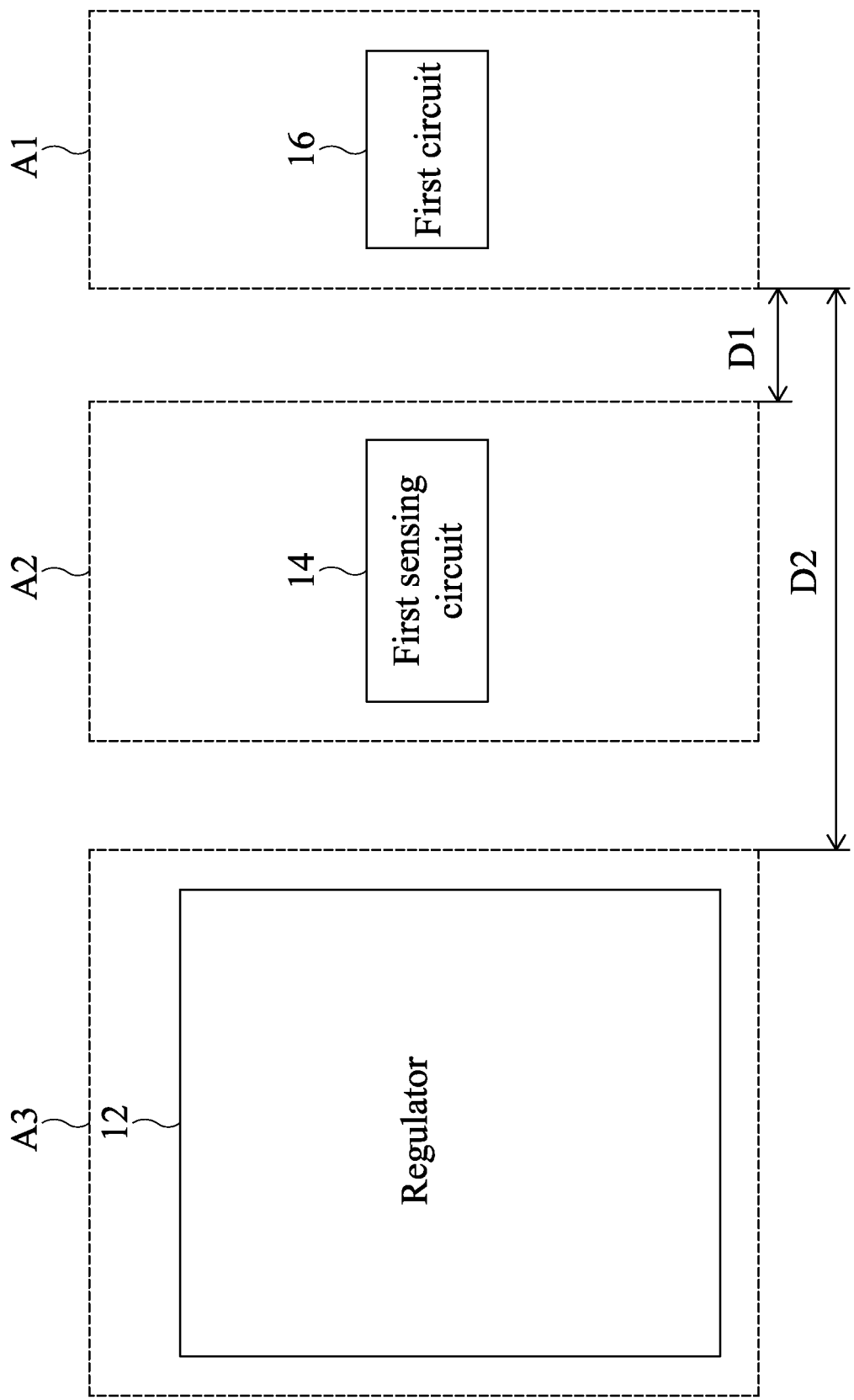
FIG. 2 is a schematic layout view of the system in FIG. 1 in accordance with some embodiments of the present disclosure.

FIG. 2 is a schematic layout view of the system 10 in FIG. 1 in accordance with some embodiments of the present disclosure. Referring to FIG. 2, a substrate 20 is provided. The substrate 20 is divided into a first region A1, a second region A2 and a third region A3, which are separate from each other. The second region A2 in space of layout is arranged closer than the third region A3 to the first region A1. In further detail, a distance D1 between the second region A2 and the first region A1 is shorter than a distance D2 between the third region A3 and the first region A1. The first circuit 16 is formed in the first region A1, the first sensing circuit 14 is formed in the second region A2 and the regulator 12 is formed in the third region A3. Due to such arrangement of those regions A1, A2 and A3, the first sensing circuit 14 in space is arranged closer than the regulator 12 to the first circuit 16. In an embodiment, the first sensing circuit 14 is located between the first circuit 16 and the regulator 12. In another embodiment, the first circuit 16 is located between the first sensing circuit 14 and the regulator 12.

Referring back to FIG. 1, the first sensing circuit 14 is arranged closer than the regulator 12 to the first circuit 16. Consequently, compared with the regulator 12, the first sensing circuit 14 is relatively accurate in sensing the first operating voltage V1. As a result, relatively little time is required for the regulator 12 to adjust the supply voltage Vs based on the first sensing result C1, thereby adjusting the first operating voltage V1 to a desired voltage level.

In some existing systems, the existing system is absent of the first sensing circuit 14 of the present disclosure. For convenience of discussion, a regulator 12 is taken as a regulator of the existing system. To adjust a supply voltage provided by such regulator, the regulator includes an integrated comparator. The comparator compares a voltage at a node, such as node n0 in FIG. 1, to a reference voltage. When a distance between the regulator 12 and the first circuit 16 increases, a value of the parasitic component DC0 increases. The voltage at the node n0 is even less accurate in reflecting a variation of the first operating voltage V1. As such, the regulator 12 is not able to accurately know a variation of the first operating voltage V1 because of the parasitic component DC0, compared with the first sensing circuit 14. As such, relatively more time is required for the regulator 12 to adjust the first operating voltage V1 to a desired voltage level.

Figure 3:
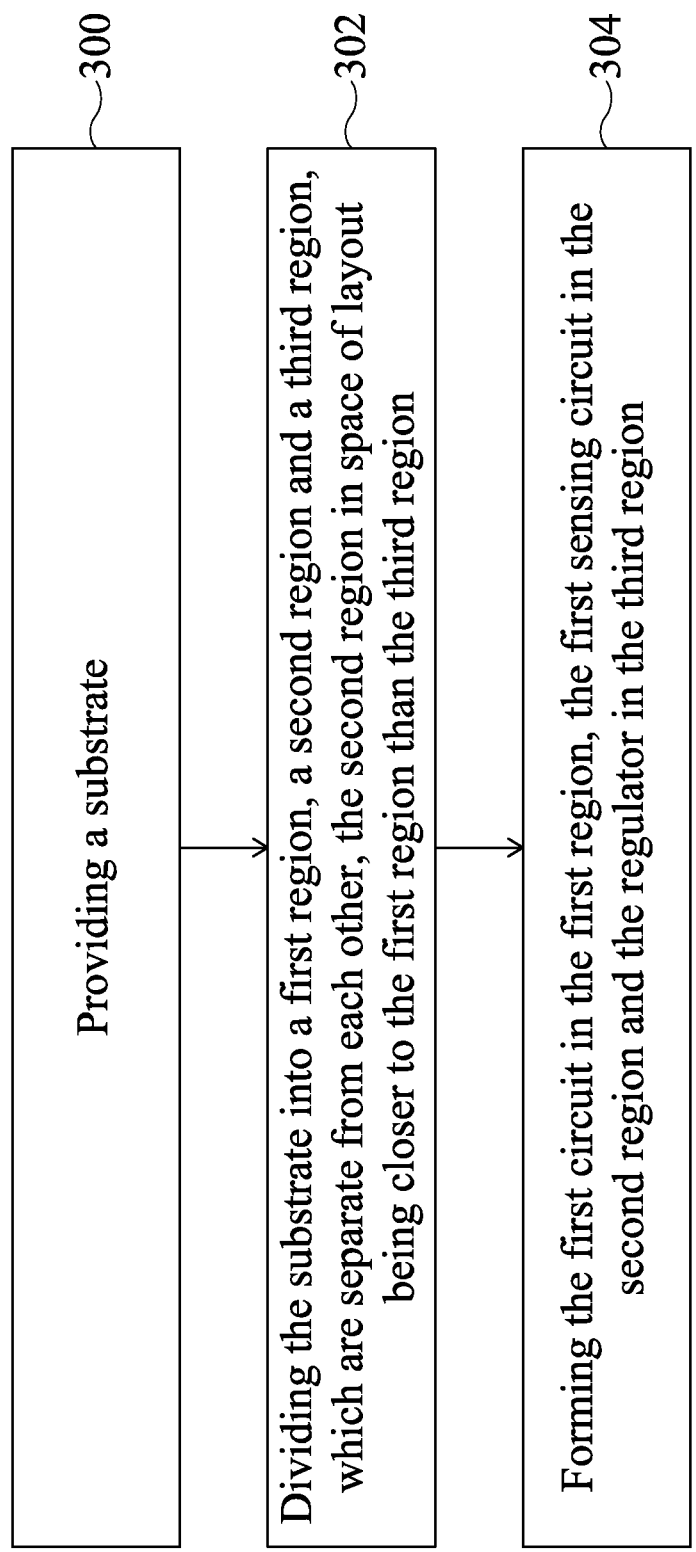
FIG. 3 is a flow chart illustrating a method of manufacturing the system in FIG. 1 in accordance with some embodiments of the present disclosure.

FIG. 3 is a flow chart illustrating a method 30 of manufacturing the system 10 in FIG. 1 in accordance with some embodiments of the present disclosure. Referring to FIG. 3, the method 30 begins with operation 300, in which a substrate is provided. The method 30 then continues with operation 302, in which the substrate is divided into a first region, a second region and a third region, which are separate from each other. The second region in space of layout is arranged closer than the third region to the first region. Subsequently, the method 30 continues with operation 304, in which the first circuit is formed in the first region, the first sensing circuit is formed in the second region and the regulator is formed in the third region.

The method 30 is merely an example, and is not intended to limit the present disclosure beyond what is explicitly recited in the claims. Additional operations can be provided before, during, and after the method 30, and some operations described can be replaced, eliminated, or moved around for additional embodiments of the method.

Figure 4:
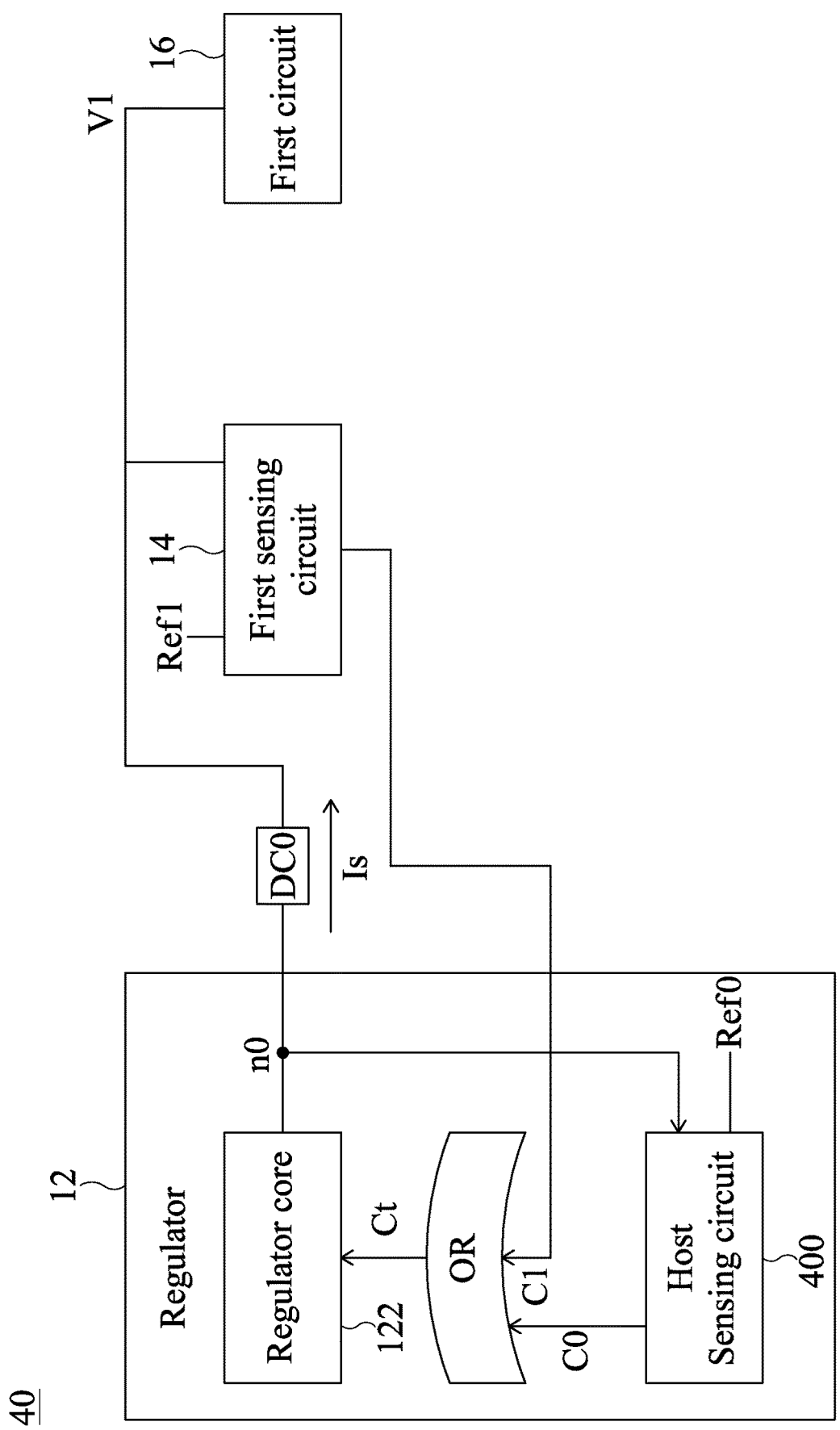
FIG. 4 is a block diagram of another system in accordance with some embodiments of the present disclosure.

FIG. 4 is a block diagram of another system 40 in accordance with some embodiments of the present disclosure. Referring to FIG. 4, the system 40 is similar to the system 10 described and illustrated with reference to FIG. 4 except that, for example, the system 40 includes an OR gate OR and a host sensing circuit 400.

The host sensing circuit 400, which is integrated in the regulator, functions to provide a host sensing result C0 by sensing the supply voltage Vs at node n0. One of the first sensing result C1 and the host sensing result C0 serves as the sensing result Ct.

In operation, when the supply voltage Vs drops and the first operating voltage V1 does not drop, the regulator core 122 raises the supply voltage Vs based on the host sensing result C0 serving as the sensing result Ct. Alternatively, when the supply voltage Vs does not drop and the first operating voltage V1 drops, the regulator core 122 raises the supply voltage Vs based on the first sensing result C1 serving as the sensing result Ct.

As discussed above, the first sensing circuit 14 is arranged closer than the regulator 12 (with integrated comparator, such as the host sensing circuit 400) to the first circuit 16. Therefore, compared with the host sensing circuit 400, the first sensing circuit 14 can more accurately sense the drop of the first operating voltage V1, compared with the host sensing circuit 400. Accordingly, relatively little time is required for the regulator 12 to adjust the supply voltage Vs based on the first sensing result C1, thereby adjusting the first operating voltage to a desired voltage level when the first operating voltage V1 drops.

Figure 5:
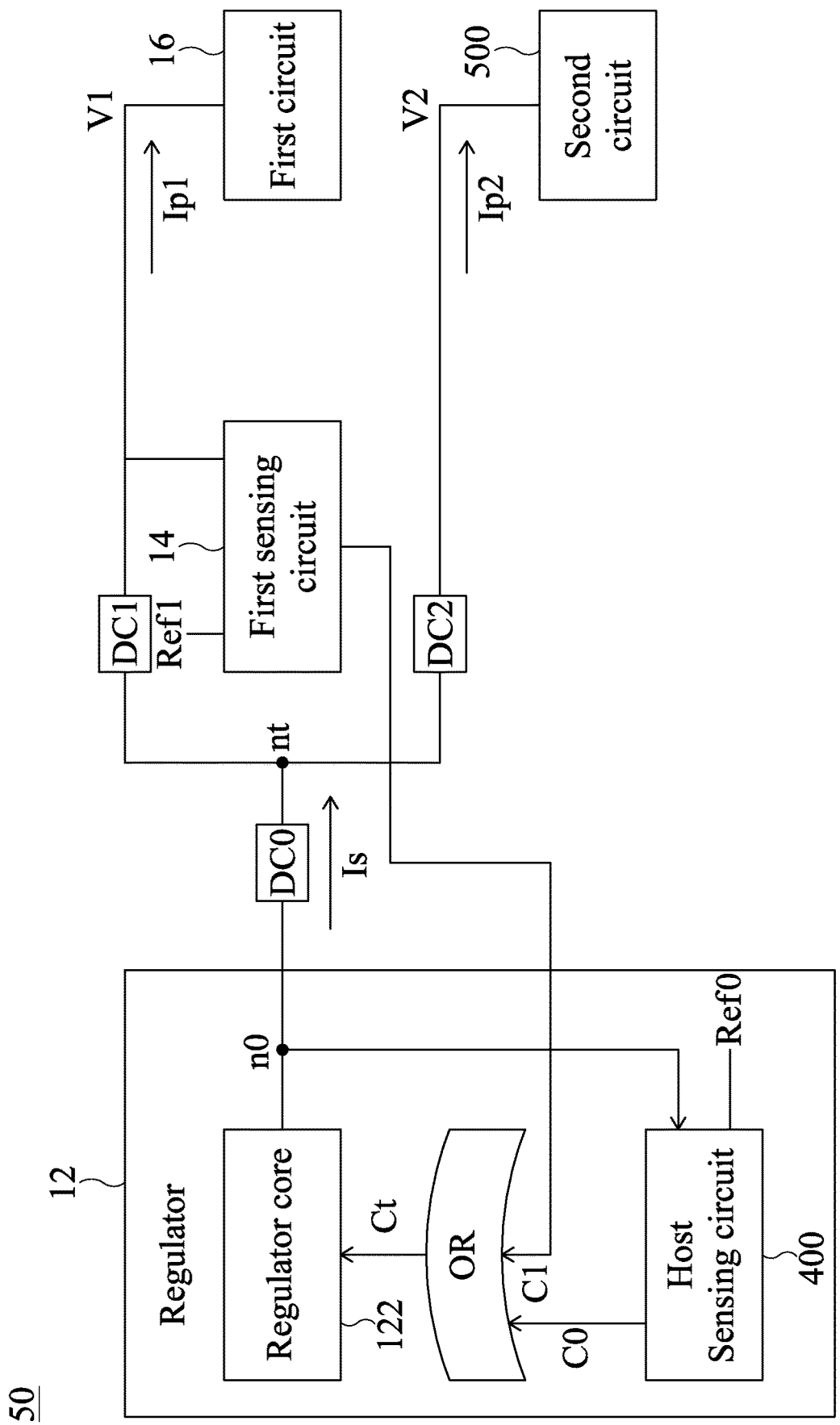
FIG. 5 is a block diagram of yet another system in accordance with some embodiments of the present disclosure.

FIG. 5 is a block diagram of yet another system 50 in accordance with some embodiments of the present disclosure. Referring to FIG. 5, the system 50 is similar to the system 40 described and illustrated with reference to FIG. 4 except that, for example, the system 50 includes a second circuit 500. The second circuit 500 operates at a second operating voltage V2 derived from the supply voltage Vs and provided by the regulator 12. The second circuit 500 is connected with the first circuit 16 at a tap nt. The regulator 12 provides the supply voltage Vs to the first circuit 16 and the second circuit 500 via the tap nt.

In an embodiment, the function of the second circuit 500 may be logic (e.g., central processing unit, microcontroller, etc.), memory (e.g., dynamic random access memory (DRAM), static random access memory (SRAM), etc.), power management (e.g., power management integrated circuit (PMIC)), radio frequency (RF), sensor, signal processing (e.g., digital signal processing (DSP)), the like, or a combination thereof.

While the second circuit 500 operates, the second circuit 500 consumes a second operating current Ip2, which is smaller than the first operating current Ip1. The second operating current Ip2 is a second portion of the supply current Is. The second operating current Ip2 is a portion of the consuming current to the supply current Is. While the first circuit 16 operates, the first circuit 16 consumes a first operating current Ip1. The first operating current Ip1 is a first portion of the consuming current to the supply current Is. Similar to the parasitic component DC0 described above, a parasitic component DC1 exists and is connected to the first circuit 16. Additionally, another parasitic component DC2 exists, and is connected to the second circuit 500. The functions and effects of the parasitic components DC1 and DC2 are similar to those of the parasitic component DC0.

Since the first circuit 16 consumes a greater amount of current than the second circuit 500, the first operating voltage V1 experiences a voltage drop that is greater than the voltage drop of the second operating voltage V2. Therefore, compared to the second operating voltage V2, it is more useful to sense the first operating voltage V1. As a result, only a single sensing circuit (i.e., the first sensing circuit 14) is adopted to sense the first operating voltage V1. By arranging a sensing circuit based on the above factors, the design is more cost-efficient than previous designs.

Figure 6:
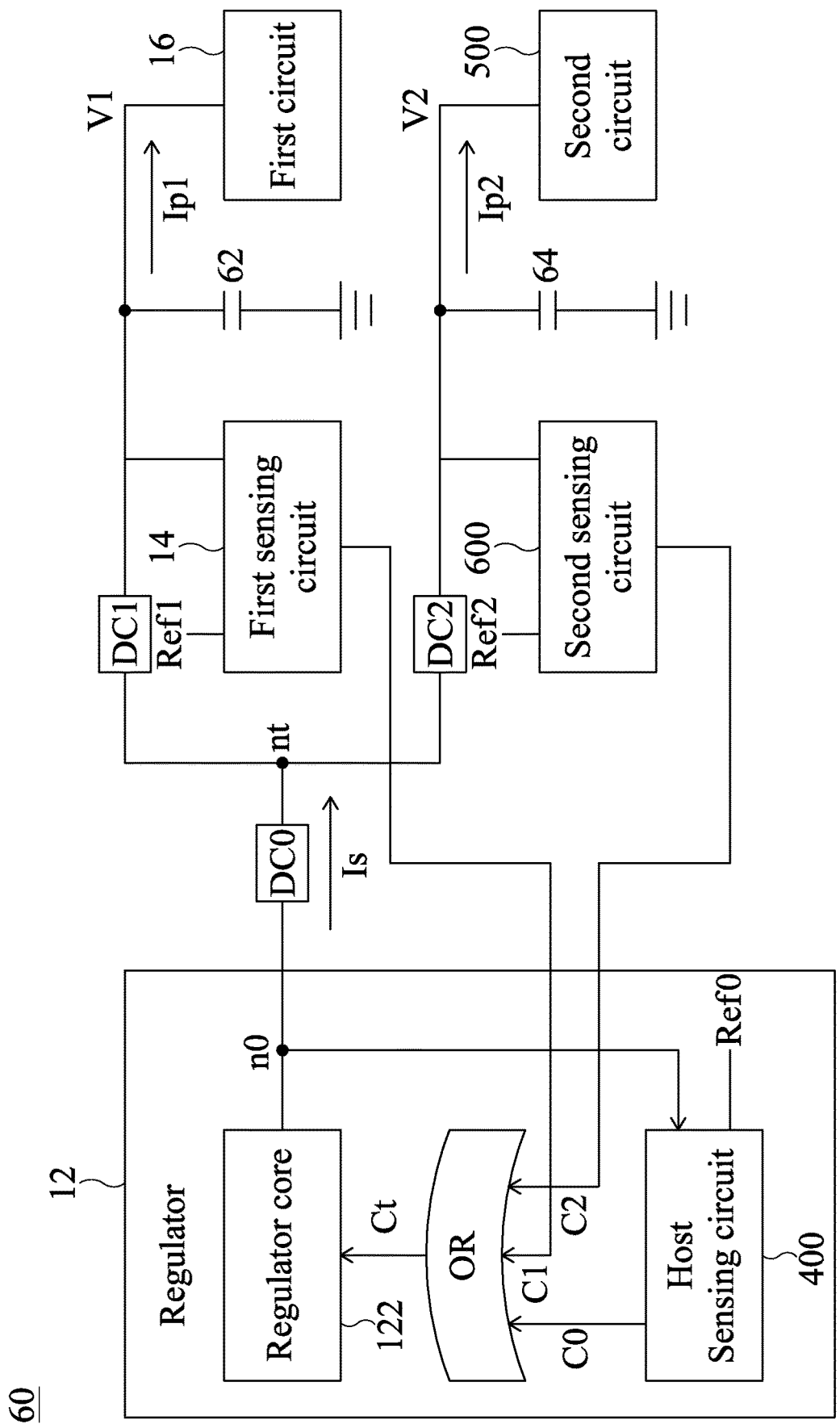
FIG. 6 is a block diagram of yet another system in accordance with some embodiments of the present disclosure.

FIG. 6 is a block diagram of yet another system 60 in accordance with some embodiments of the present disclosure. Referring to FIG. 6, the system 60 is similar to the system 50 described and illustrated with reference to FIG. 5 except that, for example, the system 60 further includes a first buffering device 62, a second buffering device 64 and a second sensing circuit 600.

The second sensing circuit 600 has the same operation as the first sensing circuit 14. Therefore, detailed description of the second sensing circuit 600 is omitted herein. The second sensing circuit 600 is independent of the regulator 12. That is, the second sensing circuit 600 is not integrated in the regulator 12. Moreover, the second sensing circuit 600 functions to provide a second sensing result C2 by sensing the second operating voltage at node n2.

In an embodiment, the second sensing circuit 600 includes a second comparator configured to provide the second sensing result C2 by comparing a reference voltage Ref2 to the second operating voltage V2. In an embodiment, the reference voltages Ref0, Ref1 and Ref2 are different from each other. In another embodiment, the reference voltages Ref0, Ref1 and Ref2 are the same. Similar to the first sensing circuit 14, the second sensing circuit 600 is placed closer to the second circuit 500 than the regulator 12. As such, there is no parasitic component, like the parasitic component DC0, existing between the second sensing circuit 600 and the second circuit 500. Consequently, the second sensing circuit 600 is able to be relatively accurate in sensing the second operating voltage V2, compared with the regulator 12. As such, relatively little time is required for the regulator 12 to adjust the second operating voltage V2 to a desired voltage level by adjusting the supply voltage Vs based on the relatively accurate second sensing result C2. Moreover, the second sensing circuit 600 and the regulator core 122 communicate with each other by means of a digital signal. Therefore, the regulator core 122 is provided with the relatively accurate sensing result C2. As a result, relatively little time is required for the regulator 12 to adjust the second operating voltage V2 to a desired voltage level.

The first buffering device 62 functions to stabilize the first operating voltage V1. However, in some circumstances, the first circuit 16 consumes too much current while operating. The first buffering device 62 may not be able to keep the first operating voltage V1 unchanged. The first operating voltage V1 may still drop even with the functioning of the first buffering device 62. In an embodiment, the first buffering device C1 includes a capacitor.

The second buffering device 64 functions to stabilize the second operating voltage V2. However, in some circumstances, the second circuit 500 consumes too much current while operating. The second buffering device 64 may not be able to keep the second operating voltage V2 unchanged. The second operating voltage V2 may still drop even with the functioning of the second buffering device 64. In an embodiment, the second buffering device 64 includes a capacitor.

Since each of the first circuit 16 and the second circuit 500 is accompanied by a sensing circuit, i.e., the first sensing circuit 14 and the second sensing circuit 600, respectively, when any one of the first operating voltage V1 and the second operating voltage V2 drops, the regulator 12 raises the supply voltage Vs, thereby adjusting the one of the first operating voltage V1 and the second operating voltage V2 which has dropped. For example, when the first circuit 16 operates and the second circuit 500 does not operate, the first operating voltage V1 drops and the second operating voltage V2 does not drop. The regulator 12 raises the supply voltage Vs based on the first sensing result C1, thereby increasing the first operation voltage V1. In further detail, when the first operating voltage V1 drops by a first voltage level, the regulator 12, in response to the first voltage level instead of other information such a voltage level on the node n0 or on the tap nt, raises the supply voltage Vs. Such mechanism means that once the first operating voltage V1 drops, the regulator 12 raises the supply voltage Vs.

In some existing system free of a sensing circuit of the present disclosure, to adjust a supply voltage provided by a regulator of the existing system, the regulator includes an integrated comparator. The comparator compares a voltage at a node, such as node n0 in FIG. 1, to a reference voltage. In the circuit structure shown in FIG. 6, the voltage at the node n0 is affected by both the first operating voltage V1 and the second operating voltage V2. As such, for example, when one of the first operating voltage V1 and the second operating voltage V2 drops, the voltage at the node n0 may not be decreased because there is no decrease of the other one of the first operating voltage V1 and the second operating voltage V2. For example, it is assumed that the first operating voltage V1 does not drop, and is 5V. The second operating voltage V2 drops by 0.2V. Because 0.2V is extremely low with respect to 5V, a voltage level at the tap nt may not be changed. Also, a voltage level at the node n0 may not be changed. As a result, the regulator 12 does not raise the supply voltage Vs, and therefore the one of the first operating voltage V1 and the second operating voltage V2 which has dropped cannot be increased.

Some embodiments have one or a combination of the following features or advantages. In some embodiments, a system is provided. The system includes a regulator, a first circuit and a first sensing circuit. The regulator is configured to provide a supply voltage, and to raise the supply voltage based on a sensing result. The first circuit is configured to operate at a first operating voltage, which is derived from the supply voltage. The first sensing circuit, independent of the regulator, is configured to provide a first sensing result by sensing the first operating voltage provided to the first circuit, wherein the first sensing circuit in space of layout is closer than the regulator to the first circuit.

In some embodiments, a system is provided. The system includes a first circuit, a second circuit and a regulator. The first circuit is configured to operate at a first operating voltage, wherein the first operating voltage drops by a first voltage level while the first circuit operates. The second circuit, coupled with the first circuit at a tap, is configured to operate at a second operating voltage. The regulator is configured to provide a supply voltage to the first circuit and the second circuit via the tap, and to, in response to the first voltage level, raise the supply voltage.

In some embodiments, a method is provided. The method includes providing a substrate; dividing the substrate into a first region, a second region and a third region, which are separate from each other, wherein the second region in space of layout is closer than the third region to the first region; and forming a first circuit in the first region, a first sensing circuit in the second region and a regulator in the third region, wherein the regulator provides a supply voltage, and raises the supply voltage based on a sensing result, wherein the first circuit operates at a first operating voltage, which is derived from the supply voltage, and wherein the first sensing circuit provides a first sensing result by sensing the first operating voltage provided to the first circuit.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A system, comprising:
   a substrate divided into a first region, a second region and a third region, which are separated from each other, wherein the second region in space of layout is arranged closer than the third region to the first region;

a first circuit in the first region and configured to operate at a first operating voltage, wherein the first operating voltage experiences a voltage drop while the first circuit operates;

a second circuit, coupled with the first circuit at a tap, configured to operate at a second operating voltage;

a first sensing circuit, in the second region and configured to provide a first sensing result by sensing the first operating voltage; and a regulator in the third region and configured to provide a supply voltage to the first circuit and the second circuit via the tap, and to raise the supply voltage based on the first sensing result.

2. The system of claim 1, wherein the first sensing circuit is independent of the regulator.

3. The system of claim 1, wherein the first sensing circuit is located between the first circuit and the regulator.

4. The system of claim 1, wherein the first circuit is located between the first sensing circuit and the regulator.

5. The system of claim 1, wherein the first sensing circuit includes a first comparator configured to provide the first sensing result by comparing a reference voltage to the first operating voltage.

6. The system of claim 1, wherein the regulator includes:
a host sensing circuit, integrated in the regulator and configured to provide a host sensing result by sensing the supply voltage; and
a regulator core configured to raise the supply voltage based on the first sensing result or the host sensing result.

7. The system of claim 1, wherein while the first circuit operates, the first circuit consumes a first operating current, and wherein the first operating current is a first portion of a supply current provided by the regulator; and wherein while the second circuit operates, the second circuit consumes a second operating current, and wherein the second operating current is a second portion of the supply current; wherein the second operating current is less than the first operating current.

8. The system of claim 1, further comprising:
a second buffering device configured to stabilize the second operating voltage.

9. The system of claim 7, wherein when the supply voltage drops and the first operating voltage does not drop, the regulator raises the supply voltage based on the first sensing result, and when the supply voltage does not drop and the first operating voltage drops, the regulator raises the supply voltage based on the first sensing result.

* * * * *